(12) United States Patent
Manouvrier

(10) Patent No.: US 9,268,743 B2
(45) Date of Patent: Feb. 23, 2016

(54) METHOD FOR DETERMINING A MATHEMATICAL MODEL OF THE ELECTRIC BEHAVIOR OF A PN JUNCTION DIODE, AND CORRESPONDING DEVICE

(71) Applicant: STMicroelectronics SA, Montrouge (FR)

(72) Inventor: Jean-Robert Manouvrier, Echirolles (FR)

(73) Assignee: STMicroelectronics SA, Montrouge (FR)

( * ) Notice: Subject to any disclaimer, the term of this patent is extended or adjusted under 35 U.S.C. 154(b) by 475 days.

(21) Appl. No.: 13/949,884

(22) Filed: Jul. 24, 2013

(65) Prior Publication Data

US 2014/0032188 A1    Jan. 30, 2014

(30) Foreign Application Priority Data

Jul. 28, 2012   (FR) ...................................... 12 57344

(51) Int. Cl.
  *G06F 17/50*   (2006.01)
  *G06F 17/10*   (2006.01)

(52) U.S. Cl.
  CPC ............ *G06F 17/10* (2013.01); *G06F 17/5036* (2013.01)

(58) Field of Classification Search
  CPC .............. G01R 19/0092; H01L 31/101; H01L 27/0255; H01L 31/107; H01L 27/0817; H01L 27/0727; H01L 27/14609; H01L 29/0615
  See application file for complete search history.

(56) References Cited

U.S. PATENT DOCUMENTS 4,326,211 A  *  4/1982  Smeets ................. H01L 31/107
                                              257/438

(Continued)

FOREIGN PATENT DOCUMENTS

EP         2154619 A1    2/2010

OTHER PUBLICATIONS

Pritchard, "Advances in the understanding of the P-N junction triode", Proceedings of the IRE, Jun. 1958.*

(Continued)

*Primary Examiner* — Kandasamy Thangavelu
(74) *Attorney, Agent, or Firm* — Gardere Wynne Sewell LLP

(57) ABSTRACT

The electric behavior of a reverse-biased PN junction diode is modeled by measuring the value of voltage V present across the diode and the value of the corresponding current I running through this diode, the voltage V varying within a range of values including the value of diode breakdown voltage. A representation of a function $$\ln\left(\frac{I}{-I_s}\right)$$

according to voltage V is established from the measured values of current I and of voltage V, $I_S$ being the saturation current of the diode. A linear function representative of a substantially linear portion of the function, characterized by voltages V greater than breakdown voltage $V_{BK}$ in terms of absolute value, is determined. An avalanche multiplication factor MM is then calculated by $$MM = 1 + e^{\left(-slbv \cdot \frac{V+bv}{bv}\right)},$$

with parameter slbv equal to the ordinate at the origin of the linear function, and parameter slbv/bv equal to the slope of the linear function.

11 Claims, 7 Drawing Sheets

(56) References Cited

U.S. PATENT DOCUMENTS

| | | | | |
|---|---|---|---|---|
| 6,078,090 A * | 6/2000 | Williams | ............ | H01L 27/0255 257/334 |
| 7,332,750 B1 * | 2/2008 | Hao | ................... | H01L 29/0615 257/130 |
| 2002/0024058 A1 * | 2/2002 | Marshall | ........... | H01L 27/14609 257/170 |
| 2002/0125541 A1 * | 9/2002 | Korec | ................ | H01L 27/0817 257/471 |
| 2008/0150069 A1 * | 6/2008 | Popovic | ................ | H01L 31/101 257/443 |
| 2010/0013458 A1 * | 1/2010 | Lany | .................. | G01R 19/0092 324/123 R |
| 2013/0248947 A1 * | 9/2013 | Kim | .................... | H01L 27/0727 257/272 |

OTHER PUBLICATIONS

Gibbons, J.F., "Graphical analysis of the I-V characteristics of generalized p-n-p-n devices", IEEE, Aug. 1967.*

Moll, J.L., "Junction transistor electronics", Proceedings of the IRE, 1955.*

Li, S.S., "Semiconductor physical electronics", Springer, 2006.*

Hefner et al., "An experimentally verified IGBT model implemented in the Saber circuit simulator", IEEE, 1994.*

Singh, P., "Power MOSFET failure mechanisms", IEEE, 2004.*

Kokosa et al., "A high-voltage, high-temperature reverse conducting thyristor", IEEE, 1970.*

Statz et al., "The spacistor, A new class of high-frequency semiconductor devices", Proceedings of the IRE, 1957.*

White, J.F., "The PN junction, Microwave semiconductor Engineering", Springer 1982.*

INPI Preliminary Search Report and Written Opinion for FR1257344 mailed Mar. 21, 2013 (10 pages).

Pawlikiewicz A H et al: "Simulation and Modeling-New Macro Model for Zeners," IEEE Ciruits and Devices Magazine, IEEE Service Cetner, Piscataway, NJ, US, vol. 9, No. 2, Mar. 1, 1993, pp. 7-11.

Wong S et al: "SPICE Macro Model for the Simulaton of Zener Diode I-V Characteristics,", IEEE Circuits and Devices Magazine, IEEE Service Center, Piscataway, NJ, US, vol. 7, No. 4, Jul. 1, 1991, pp. 9-12.

Yu Wang et al: "Electrothermal Modeling of ESD Diodes in Bulk-Si and SOI Technologies," Electrical Overstress/Electrostatic Discharge Symposium Proceedings 2000, Sep. 26-28, 2000, Piscataway, NJ, US, IEEE, pp. 430-436.

Mantooth H A E al: "A Unified Diode Model for Circuit Simulation," Power Electronics Specialists Conference, 1995, PESC '95 Record., 26th Annual IEEE Atlanta, GA, US, Jun. 18-22, 1995, New York, NY, US, IEEE, vol. 2, Jun. 18, 1995, pp. 851-857.

Mantooth H A: "A Unified Diode Model with Self-Heating Effects," Bipolar/BICMOS Circuits and Technology Meeting, 1995, Proceedings of the 1995 Minneapolis, MN, US Oct. 2-3, 1995, New York, NY, US, IEEE, Oct. 2, 1995, pp. 62-65.

* cited by examiner

US 9,268,743 B2

METHOD FOR DETERMINING A MATHEMATICAL MODEL OF THE ELECTRIC BEHAVIOR OF A PN JUNCTION DIODE, AND CORRESPONDING DEVICE

PRIORITY CLAIM

This application claims priority from French Application for Patent No. 1257344 filed Jul. 28, 2012, the disclosure of which is incorporated by reference.

TECHNICAL FIELD

The present disclosure relates to the field of PN junction semiconductor devices such as diodes, and more specifically relates to the mathematical modeling of their electric behavior, especially in avalanche mode.

BACKGROUND

A PN junction device, such as a diode, is generally formed by the juxtaposing of a P type semiconductor and of an N-type semiconductor. A region where the diode operates in avalanche mode can especially be identified on the theoretical current I/voltage V characteristic of a PN junction. In this region, the diode is reverse biased with a voltage thereacross going beyond a given reverse voltage V called avalanche voltage $V_{BK}$ (or breakdown voltage), and the diode conducts a reverse current I which very rapidly increases. The avalanche phenomenon is generally induced for high reverse voltages (generally higher than 8 volts of reverse voltage), and the avalanche effect especially appears as a multiplication of charge carriers and the creation of a very high current.

In practice, it is possible to design PN junction diodes which, in avalanche mode, are capable of withstanding very high powers for a few tens of microseconds. Such diodes may especially be integrated in circuits as devices of protection against electrostatic discharges (ESD) which may reach several tens or even a few hundreds of volts.

Further, to decrease the time and the cost of the development cycle of an integrated circuit, simulation tools are more and more used to predict the circuit behavior in specific operating conditions. Such simulation tools generally comprise a library of mathematical models representative of the electric behavior of the components.

In particular, the electric behavior of the diode in avalanche mode may be modeled by Miller's equations:

$$I_{BK} = I_D \cdot (MM - 1)$$

$$MM = \frac{1}{1 - \left(\frac{V}{V_{BK}}\right)^{mc}}, \text{ when } V < V_{BK}$$

$$MM = \frac{1}{1-(1-\varepsilon)} + \frac{mc}{V_{BK}} \cdot \left(\frac{(1-\varepsilon)^{\frac{mc-1}{mc}}}{1-(1-\varepsilon)^2}\right) \cdot \left(V_{BK} \cdot (1-\varepsilon)^{\frac{1}{mc}} - V\right),$$

when $V \geq V_{BK}$
with
$I_{BK}$: the diode current in avalanche mode,
MM: the avalanche multiplication factor,
$I_D$: the current of the diode provided by the Shockley model,
$V_{BK}$: the avalanche breakdown voltage,
V: the voltage across the diode,
mc and ε: parameters to be empirically determined.

However, the above mathematical model does not provide a specific representation of the real behavior of the diode in avalanche mode, in particular when reverse voltage V across the diode goes beyond breakdown voltage $V_{BK}$, as illustrated in FIGS. 1 and 2. In FIGS. 1 and 2, the axis of abscissas corresponds to reverse voltage V and the axis of ordinates corresponds to reverse current I in logarithmic scale. Curve $C_0$ corresponds to the real characteristic of the diode in avalanche mode, curve $C_{11}$ corresponds to the diode characteristic according to the Miller model with $\varepsilon = 1.e^{-5}$, and curve $C_{12}$ corresponds to the diode characteristic according to the Miller model with $\varepsilon = 2.e^{-3}$.

As can be observed in FIGS. 1 and 2, for $\varepsilon = 1.e^{-5}$ (FIG. 1), the diode characteristic according to Miller's model is correctly adjusted to the portion where the amplitude of curve $C_0$ is maximum, but is not satisfactory at the level of the substantially linear portion of curve $C_0$. Conversely, for $\varepsilon = 2.e^{-3}$ (FIG. 2), the diode characteristic according to Miller's model is correctly adjusted to the substantially linear portion of curve $C_0$, but is not satisfactory at the level of the portion where the amplitude of curve $C_0$ is maximum.

The Miller model is thus not fully satisfactory since it does not enable to have the characteristic according to the Miller model simultaneously coincide with the real characteristic of the diode, at the level of the two portions (maximum amplitude and substantially linear portion).

Further, the Miller model is discontinuous around the breakdown voltage and thus requires a linearization around this breakdown voltage.

Another solution suggested in European Patent Application No. 2,154,619 (the disclosure of which is incorporated by reference) is to determine two currents by using a model which involves a sum of exponential type expressions. However, such solution involves a great number of parameters to be extracted. Further, as in the Miller's model, the model provided is also discontinuous around the breakdown voltage. Besides, the use of Shockley's equation for determining the reverse current, notably for reverse voltages which do not go beyond the breakdown voltage, does not allow reflecting the thermodynamic behavior of the PN junction at the breakdown point.

A more accurate mathematical model of the electric behavior of a PN junction diode is thus needed.

SUMMARY

In such a context, a new method for determining a mathematical model of the electric behavior of a PN junction diode, as well as the device implementing this new method, are discussed hereafter. In particular, the new mathematical model is a function that provides a continuous representation of the electrical behavior of the PN junction around the breakdown voltage.

For this purpose, a method for determining a mathematical model of the electric behavior of a reverse-biased PN junction diode is provided, comprising:

measuring the value of voltage V present across the diode and the value of the corresponding current I running through this diode, said diode being reverse-biased and said voltage V varying within a range of values including the value of breakdown voltage $V_{BK}$ of said diode;

establishing a representation of function $$\ln\left(\frac{I}{-I_s}\right)$$

according to voltage V, from said measured values of current I and of voltage V, $I_S$ being the saturation current of said diode;

determining a first linear function representative of a substantially linear portion of said function $$\ln\left(\frac{I}{-I_s}\right),$$

said linear portion being characterized by voltages V greater than breakdown voltage $V_{BK}$ in terms of absolute value;

calculating an avalanche multiplication factor defined by:

$$MM = 1 + e^{\left(-slbv \cdot \frac{V+bv}{bv}\right)},$$

wherein:
the values of parameters slbv and bv are extracted from said linear function,
slbv being equal to the ordinate at the origin of said linear function, and
slbv/bv being equal to the slope of said linear function.

Advantageously, the method further comprise the step of extracting the value of the saturation current Is of said diode by determining the current I when the voltage V across the diode is equal to zero, from a current-vs-voltage characteristic of said diode in forward-bias operation, and for a given temperature.

For example, the step of determining the first linear function may comprise:

based on the measured values of voltage V and current I, determining the value of a inflection voltage $V_{LIN}$ for which second numerical derivative $d^2I/dV^2$ is maximum; and determining the equation of the tangent of said function $$\ln\left(\frac{I}{-I_s}\right)$$

at an inflection point, said inflection point having said inflection voltage $V_{LIN}$ as an abscissa.

Parameters slbv and bv can be extracted from said tangent, slbv being equal to the ordinate at the origin of said tangent and slbv/bv being equal to the slope of said tangent.

Advantageously, the method can further comprise:
establishing a representation of function $$\ln\left(\frac{I - I_s \cdot e^{\left(-slbv \cdot \frac{V+bv}{bv}\right)}}{-I_s}\right)$$

according to voltage V across the diode, from said measured values of current I and of voltage V, and from said extracted values of slbv and bv;

determining a second linear function representative of a substantially linear portion of said function $$\ln\left(\frac{I - I_s \cdot e^{\left(-slbv \cdot \frac{V+bv}{bv}\right)}}{-I_s}\right),$$

said portion being characterized by voltages V smaller than breakdown voltage $V_{BK}$ in terms of absolute value;

calculating the avalanche multiplication factor defined by:

$$MM = 1 + e^{\left(-slbv \cdot \frac{V+bv}{bv}\right)} + e^{-smbv(V+bv+off)},$$

wherein:
the values of parameters smbv and off are extracted from said second linear portion;
smbv being the slope of said second linear function; and
smbv (bv+off) being the ordinate at the origin of said second linear function.

The step of determining said second linear function can be performed for values of reverse voltage V ranging between a first voltage and by, said first voltage being smaller than the value of bv in term of absolute value.

The step of determining said second linear function can also be performed for values of reverse voltage V ranging between a second voltage and by, said second voltage being greater than the value of bv in term of absolute value.

BRIEF DESCRIPTION OF THE DRAWINGS

The foregoing and other features and advantages of the present invention will now be discussed in the following non-limiting description of a specific embodiment, in relation with the accompanying drawings.

Figure 8:
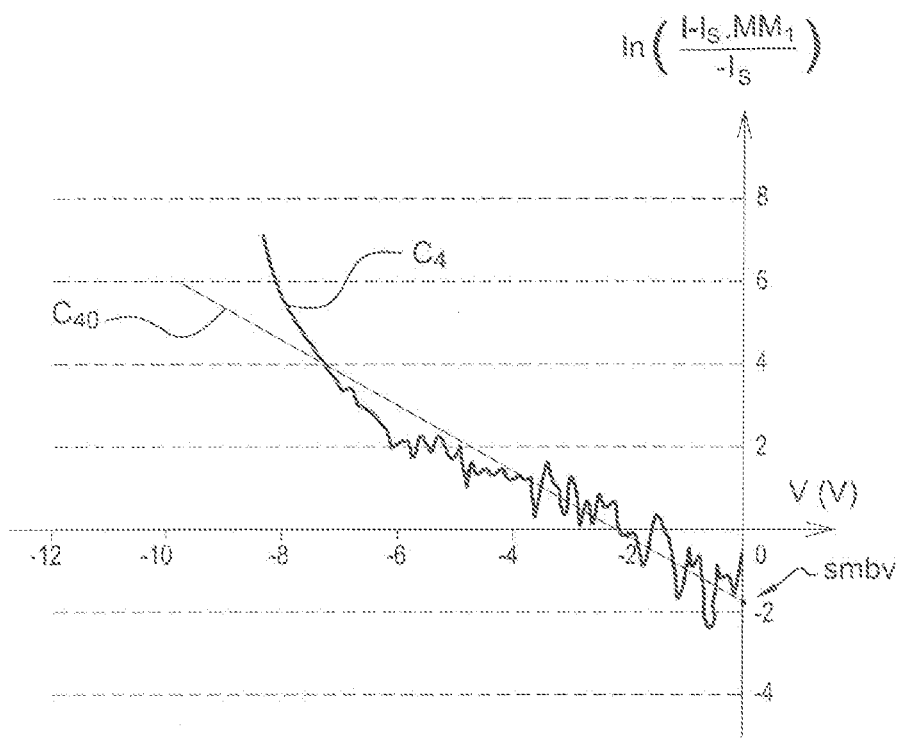
Figure 9:
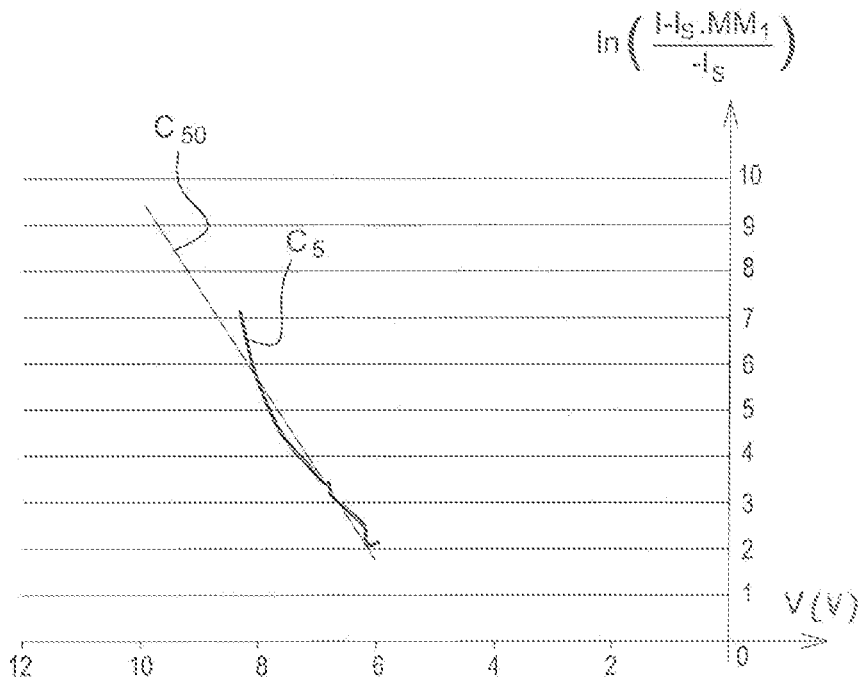
Figure 10:
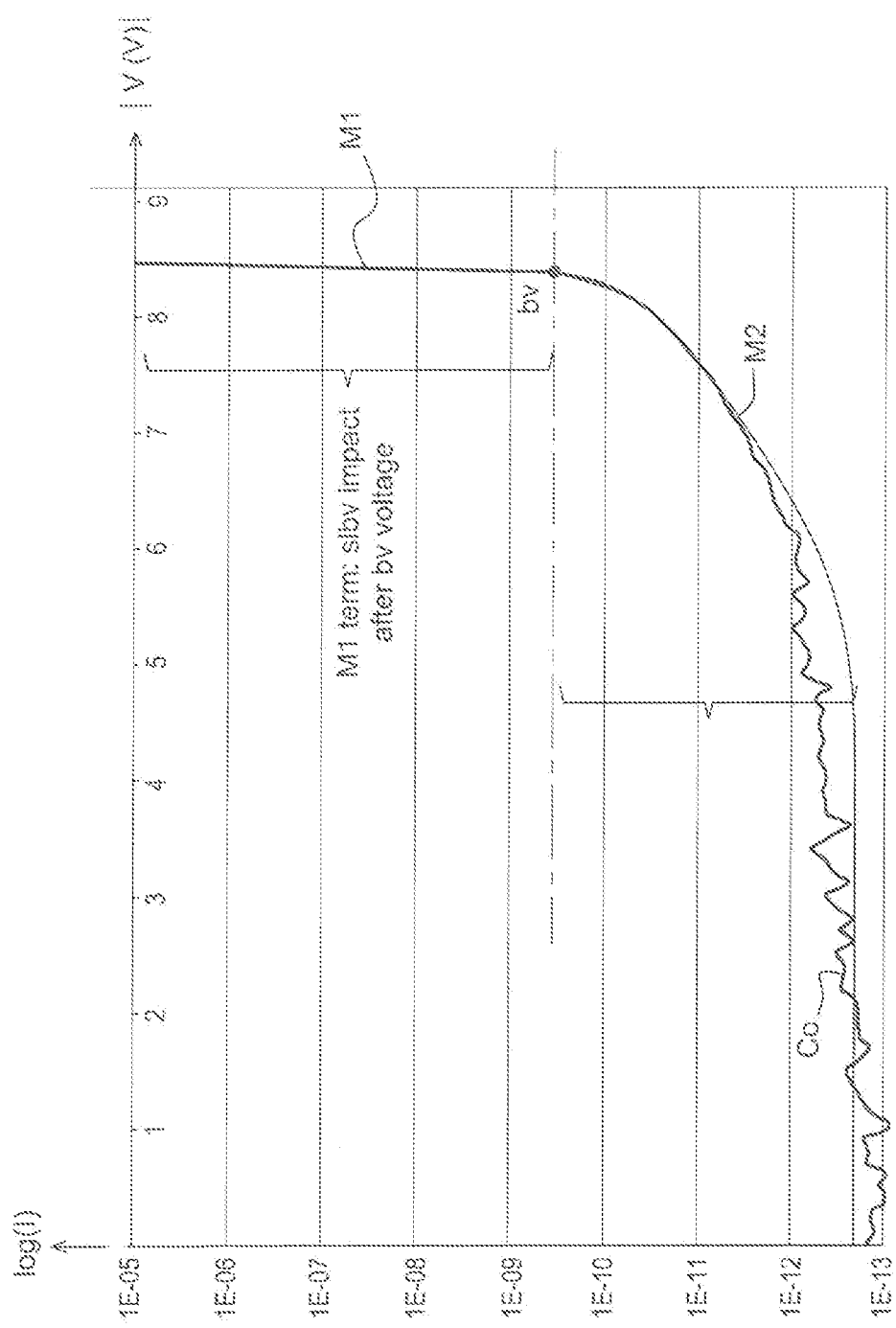

versus reverse voltage V across the diode;

FIG. 8 is a graphic representation of function $$\ln\left(\frac{I - I_s \cdot e^{\left(-slbv \cdot \frac{V+bv}{bv}\right)}}{-I_s}\right)$$

versus reverse voltage V across the diode, voltage V varying within interval [0; bv];

FIG. 9 is a graphic representation of function $$\ln\left(\frac{I - I_s \cdot e^{\left(-slbv \cdot \frac{V+bv}{bv}\right)}}{-I_s}\right)$$

versus reverse voltage V across the diode, voltage V varying within interval [6 volts; bv];

FIG. 10 is a graphic representation of the real characteristic of the diode and of the mathematical model of said diode determined with the functions of FIGS. 8 and 9.

Figure 11:
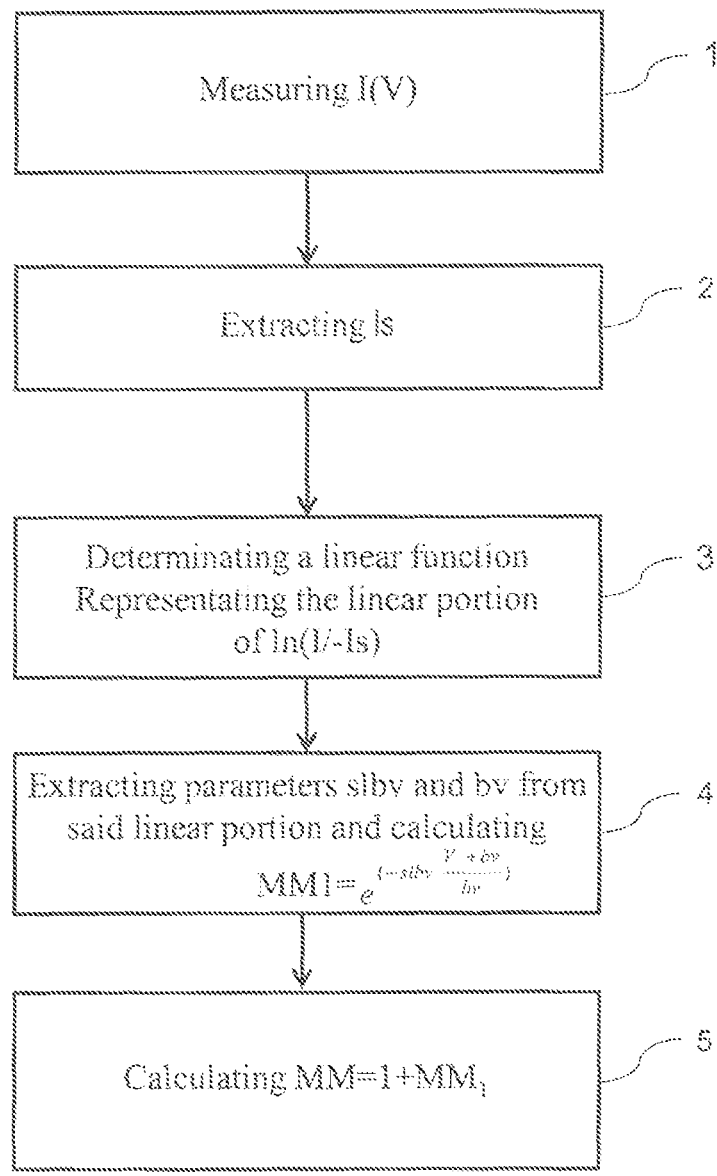
Figure 12:
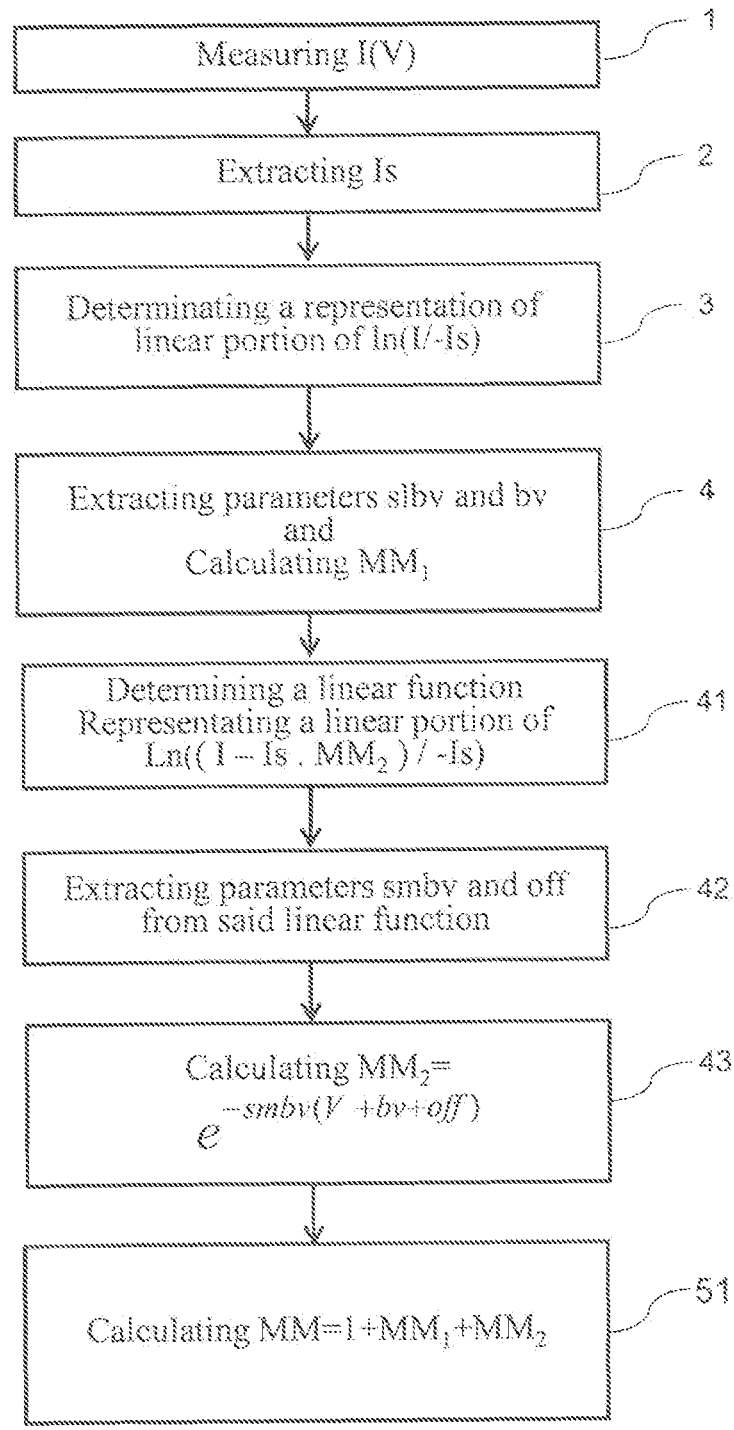

FIG. 11 is a representation of the steps of the method for determining multiplication factor MM according to an embodiment; and FIG. 12 is a representation of the steps of the method for determining multiplication factor MM according to another embodiment.

For clarity, the same elements have been designated with the same reference numerals in the different drawings and the various drawings are not to scale.

DETAILED DESCRIPTION OF THE DRAWINGS

Figure 1:
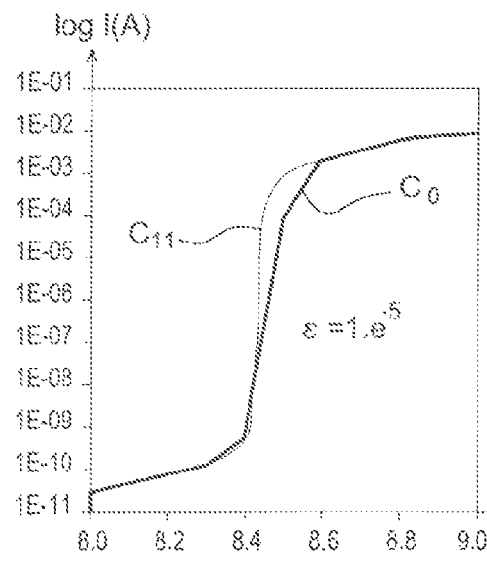
FIG. 1 is a graphic representation of a portion of the real current-vs.-voltage characteristic and of the Miller model characteristic for $\epsilon=1e^{-5}$ of a diode when the voltage thereacross varies around its breakdown voltage.
Figure 2:
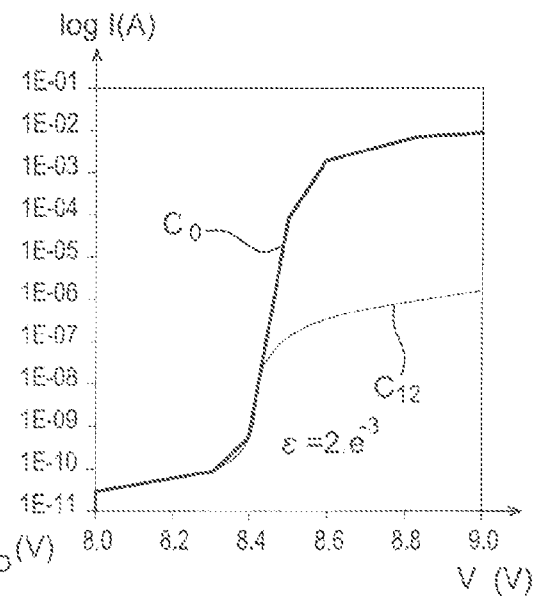
FIG. 2 is a graphic representation of a portion of the real current-vs.-voltage characteristic and of the Miller model characteristic for $\epsilon=2e^{-3}$ of a diode when the voltage thereacross varies around its breakdown voltage.
Figure 3A:
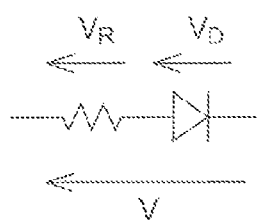
FIG. 3A is a conventional representation of a PN junction diode.
Figure 3B:
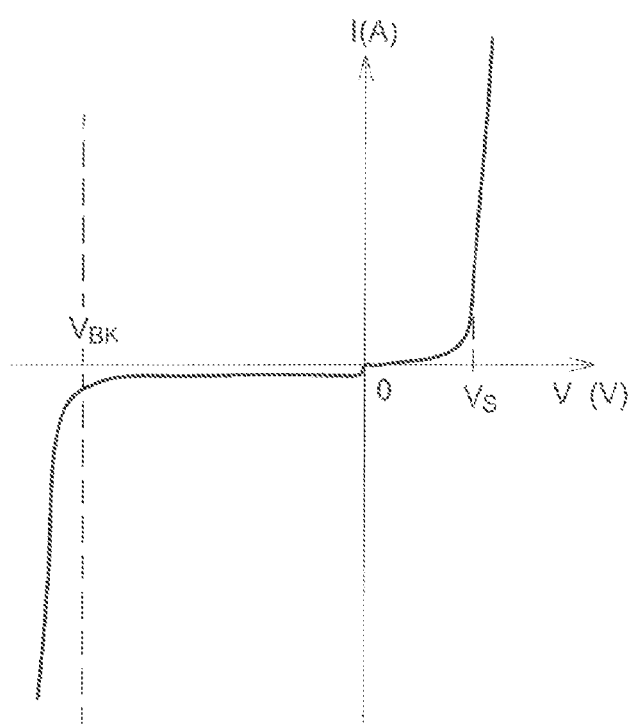
FIG. 3B is a theoretical representation of the current-vs.-voltage characteristic of a PN junction diode.

As illustrated in FIG. 3A, a PN junction diode is conventionally represented as an ideal diode in series with a resistor. The theoretical characteristic of current I-vs.-voltage V of said PN junction diode is illustrated in FIG. 3B. Three regions can generally be identified on this theoretical characteristic. In a first region R1, the diode operates in forward mode, that is, it is forward biased and behaves as a closed circuit. More specifically, forward current I crossing the diode exponentially increases according to forward voltage V applied thereacross. In addition, the forward voltage V in this first region R1 is equal to the voltage $V_R$ across the resistor plus the voltage $V_D$ across the ideal diode. In a second region R2, the diode operates in reverse mode, that is, it is reverse biased and behaves as an open circuit. More specifically, reverse current I crossing the diode is very low and will be independent from forward voltage V applied thereacross. In this second region R2, the voltage across the resistance is negligible and the forward voltage V is considered to be substantially equal to the voltage $V_D$ across the ideal diode. In a third region R3, the diode operates in avalanche mode, that is, it is reverse biased but the voltage applied thereacross goes beyond a given reverse voltage V called breakdown voltage $V_{BK}$. In particular, in avalanche mode, the diode conducts a reverse current I which increases very fast, and the reverse voltage V across the diode is equal to the sum of the voltage $V_D$ across the ideal diode and the breakdown voltage. In practice, the reverse voltage V in this third region R3 is considered to be substantially equal to the breakdown voltage $V_{BK}$. Generally, breakdown voltage $V_{BK}$ of the diode is provided by the constructor for a determined current.

Reverse voltage means the voltage applied across the reverse-biased diode, and forward voltage means the voltage applied across the forward-biased diode. Such forward and reverse voltages, as well as the breakdown voltage, are expressed in positive values. Similarly, reverse current designates the current flowing through the reverse-biased diode, and forward current designates the current flowing through the forward-biased diode. Such forward and reverse currents are also expressed in positive values.

A method for determining the mathematical model of the electric behavior of the PN junction diode in avalanche mode is discussed hereafter.

The modeling method is especially based on the knowledge of the real characteristics of the diode to be modeled and obtained from measurements. More specifically, the diode to be modeled is reverse-biased and the values of the current flowing through the diode are raised according to the voltage values applied thereacross. A representation (diagram or table) of the electric behavior of the diode is thus obtained from these measurements. Then, based on this representation, a mathematical model enabling to plot a curve which is the most representative of the real electric behavior of this diode in avalanche mode is determined.

In particular, according to an embodiment, the behavior of the reverse-biased diode, and especially for voltages thereacross varying around breakdown voltage $V_{BK}$, is considered to be given by:

$$I_{BK} = I_D \cdot (MM - 1)$$
$$MM = 1 + e^{\left(-slbv \cdot \frac{V+bv}{bv}\right)} = 1 + MM_1 \text{ with}$$
$$MM_1 = e^{\left(-slbv \cdot \frac{V+bv}{bv}\right)}$$

V: the voltage across the diode,
$I_{BK}$: the current running through the diode in reverse biasing and for voltages varying around the breakdown voltage,
$I_D$: the current running through the diode in reverse mode and in forward mode and modeled by Shockley's equation,
MM: the multiplication factor in avalanche mode,
slbv: a first parameter having a value which will be determined hereafter,
bv: a second parameter having a value which will also be determined hereafter.
The Shockley equation is given by:

$$I_D = I_s \cdot \left(e^{\frac{V}{nV_T}} - 1\right)$$

with
$I_D$: the current running through the diode in forward or reverse mode,
$I_s$: the diode saturation current,
V: the voltage across the diode,
n: a coefficient taken to be equal to 1 by default, and
$V_T$: the thermal voltage.

The expression of MM given above allows representing the reverse-biased diode as a continuous function, especially around the breakdown voltage. In other words, the modeling of the reverse-biased diode does not require two separate functions or representations, as in the Miller's solution. On the contrary, the electrical behavior of the reverse-biased diode, namely in the second and third regions, can be represented with a single function which does not present discontinuity at the breakdown voltage.

Referring to FIG. 11, the method for determining the mathematical model of the electric behavior of the PN junction diode in avalanche mode thus may comprises the following steps:
- in a first step (1), measurements of the current I flowing through the diode according to voltage V applied thereacross, are performed;
- in a second step (2), the value of the saturation current Is is extracted;
- in a third step (3), a representation of a linear portion of the function ln(I/–Is) is determined;
- in a fourth step (4), the parameters slbv and bv are extracted from said representation of the linear portion;
- in a fifth step (5), MM is then calculated according to the expression given above.

The above steps are detailed below:

The first step (1) comprises performing measurements providing current I flowing through the diode according to voltage V applied thereacross. In practice, the diode is reverse-biased and reverse voltage V across the diode varies within a range of values including the value of breakdown voltage $V_{BK}$ of the diode.

Figure 4:
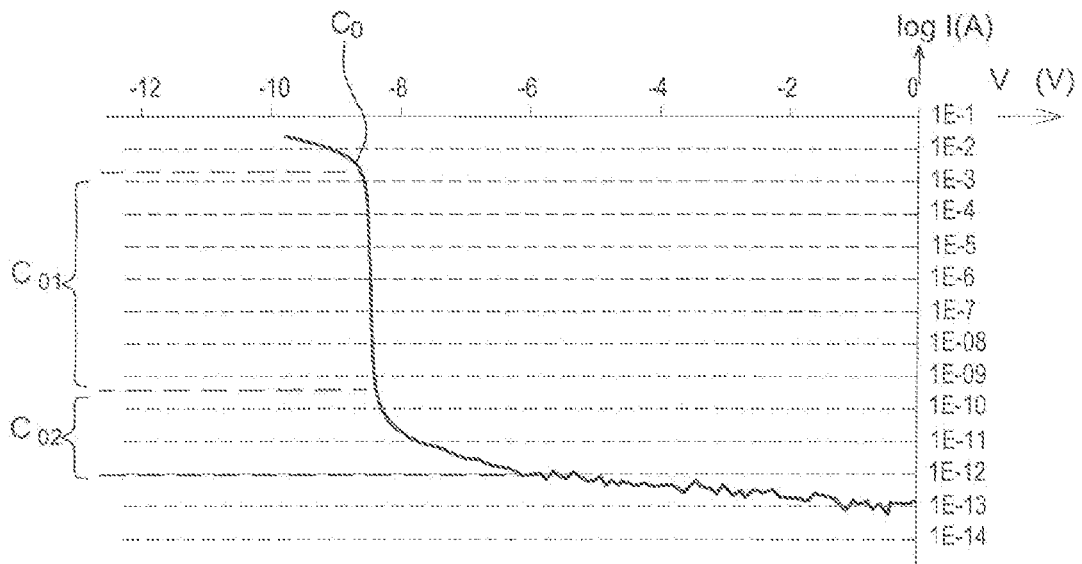
FIG. 4 is a graphic representation of the real current-vs.-voltage characteristic of the reverse-biased PN junction diode.

For example, curve $C_0$ of FIG. 4 is the graphic representation of the real current-vs.-voltage characteristic of the reverse-biased PN junction diode obtained based on the current and voltage measurements. The axis of ordinates is in logarithmic scale and is relative to reverse current I flowing through the diode, and the axis of abscissas corresponds to reverse voltage V applied across the diode. Reverse voltage V especially varies between a minimum reverse voltage Vmin, for example, on the order of 0 volt, and a maximum reverse voltage Vmax, for example, on the order of 10 volts.

Two distinct portions $C_{01}$ and $C_{02}$ can especially be identified in this characteristic. A first portion $C_{01}$ corresponds to the substantially linear portion of curve $C_0$, for which reverse voltage V is greater than breakdown voltage $V_{BK}$. Second portion $C_{02}$ corresponds to the substantially bent portion of curve $C_0$, for which reverse voltage V is lower than breakdown voltage $V_{BK}$.

Figure 5:
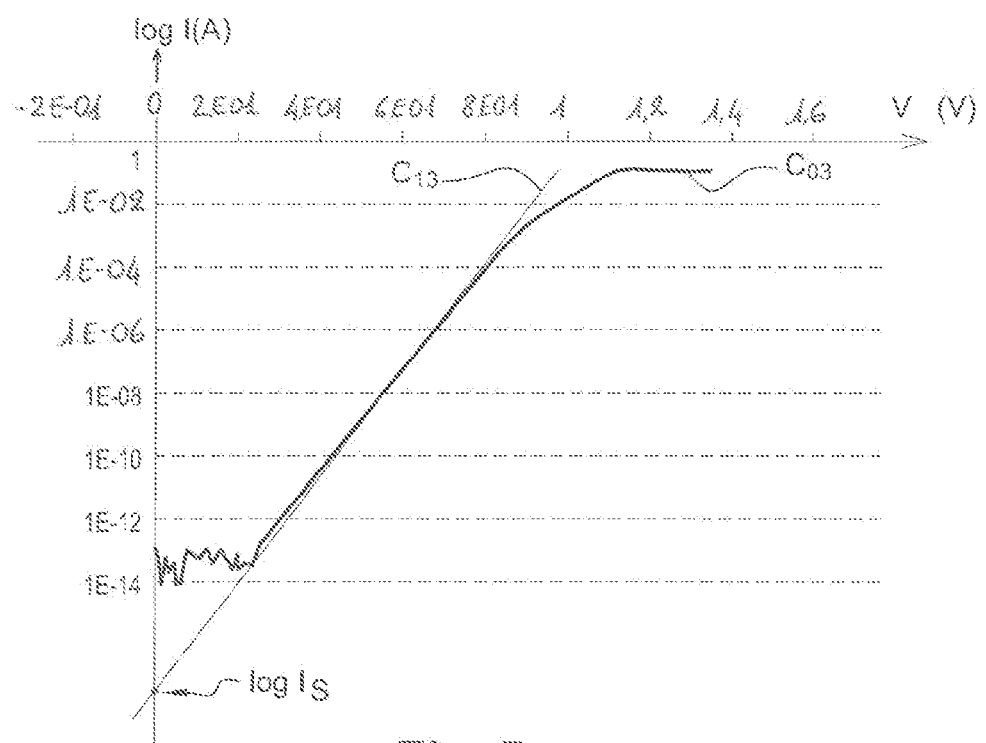
FIG. 5 is a graphic representation of the current-vs.-voltage characteristic of the forward-biased diode used to extract the value of the saturation current of the diode at a given temperature, and a graphic representation of the Shockley equation obtained with the extracted value of the saturation current.

The second step (2) of the method may comprise extracting the value of the saturation current Is of the diode. Said value can be deduced from the current-vs.-voltage characteristic of the diode in forward operation and for a given temperature. For example, curve $C_{03}$ of FIG. 5 is the graphic representation of the real current-vs.-voltage characteristic of the forward-biased diode, and especially for a forward voltage V varying between 0 volt and 1.6 volt, and curve $C_{13}$ is the graphic representation of the Shockley equation with the extracted value of saturation current Is. Indeed, generally, in forward biasing, the Shockley equation may be simplified as follows:

$$I_D = I_s \cdot \left(e^{\frac{V}{V_T}} - 1\right) \approx I_s \cdot \left(e^{\frac{V}{V_T}}\right);$$

Thereby: $I_S \approx I_D / \left(e^{\frac{V}{V_T}}\right)$

The value of the saturation current Is can be extracted from the curve $C_{13}$ by determining the value of log(Is) when V is equal to zero.

Based on such experimental measurements of reverse current I and reverse voltage V, and on the value of the saturation current Is, a representation (diagram or table) of function $$\ln\left(\frac{I}{-I_s}\right)$$

according to voltage V, can be established, I being the measured current and $I_s$ being the diode saturation current.

Figure 7:
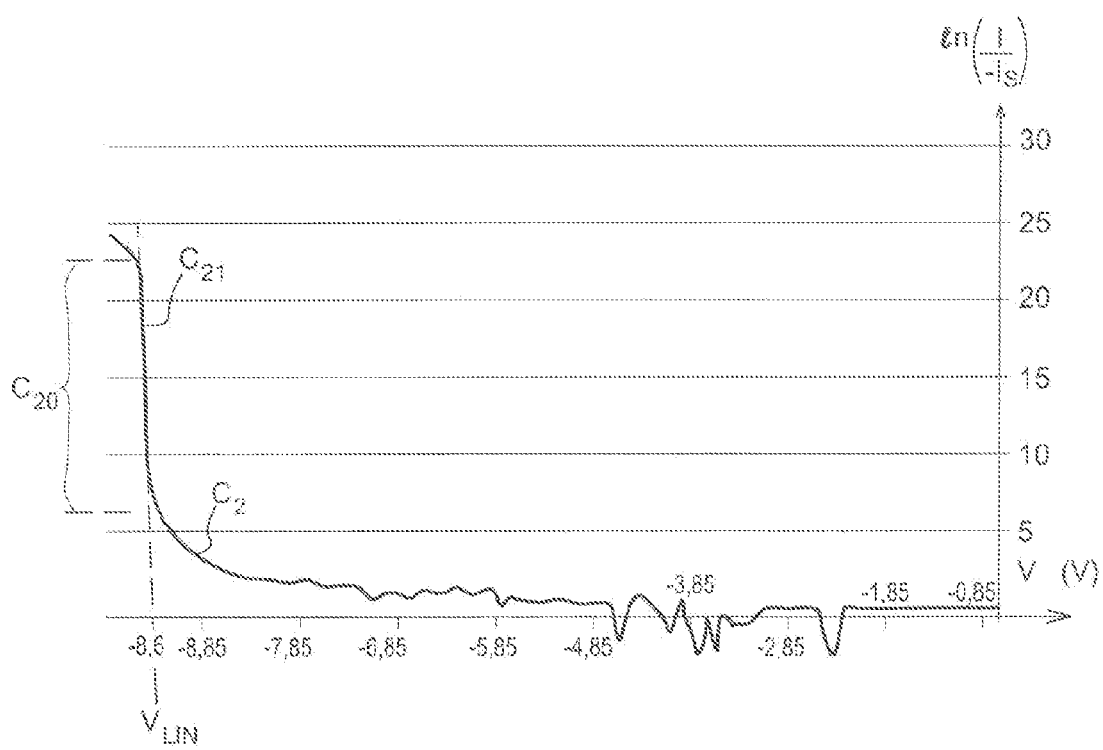
FIG. 7 is a graphic representation of function $$\ln\left(\frac{I}{-I_s}\right)$$

Curve $C_2$ of FIG. 7 is the graphic representation of function $$\ln\left(\frac{I}{-I_s}\right)$$

according to the measured values of reverse voltage V. It should especially be noted that curve $C_2$ also has a first substantially linear portion $C_{20}$ characterized by reverse voltages V greater than breakdown voltage $V_{BK}$.

The determination of this first linear function representative of this first portion $C_{20}$ enables to calculate the above-defined avalanche multiplication factor by $$MM = 1 + e^{\left(-slbv \cdot \frac{V+bv}{bv}\right)}$$

where:
- parameter "slbv" is determined by considering that "–slbv" is equal to the ordinate at the origin of this first linear function, and
- parameter "bv" is determined by considering that "–slbv/bv" is equal to the slope of this first linear function.

In particular, the third step (3) comprises the determination of this first linear function may especially comprise determining the value of a inflection voltage $V_{LIN}$ for which second numerical derivative $d^2I/dV^2$ is maximum. Of course, the calculation of the second numerical derivative is performed from previously-measured values of voltage V and of current I.

For example, the second numerical derivative $d^2I/dV^2$ may be obtained by successively applying Euler's method or a half-step derivation, or by linear regression, or any other adapted method.

Figure 6:
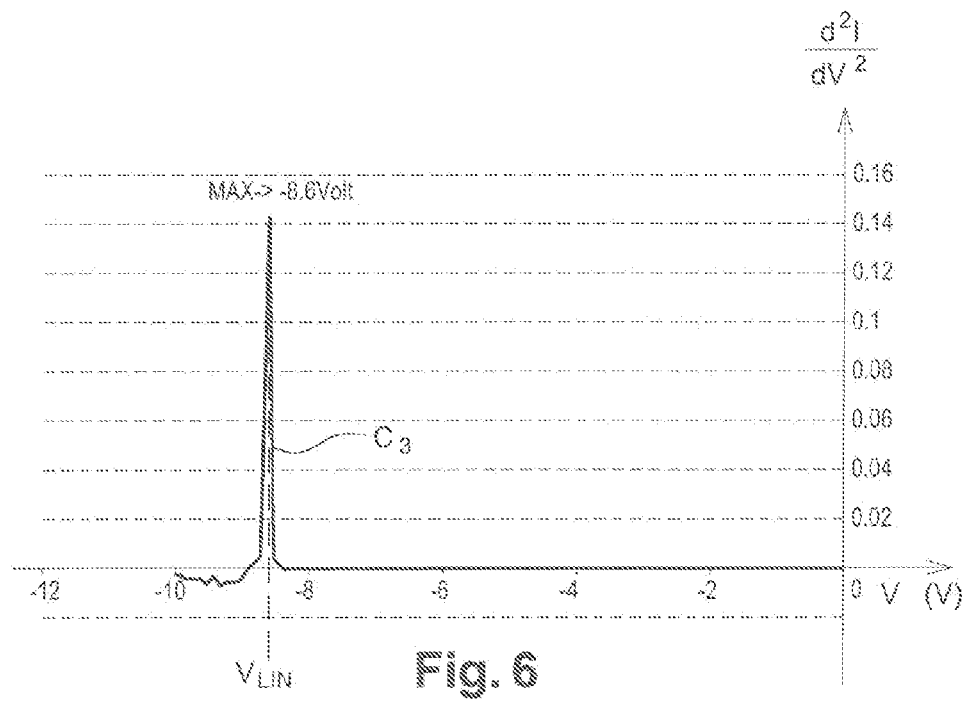
FIG. 6 is a graphic representation of second derivative $d^2I/dV^2$.

For example, curve $C_3$ of FIG. 6 is the graphic representation of second derivative $d^2I/dV^2$ according to the measured values of reverse voltage V. It should especially be noted that, for the diode used to form these curves, the second numerical derivative is maximum for an inflection voltage $V_{LIN}$ equal to –8.6 volts.

Once the inflection voltage $V_{LIN}$ has been determined, it is then sufficient to determine the equation of the tangent of function $$\ln\left(\frac{I}{-I_s}\right)$$

at an inflection point having as an abscissa the value of the inflection voltage $V_{LIN}$.

For example, the equation of the tangent, shown by line $C_{21}$ in FIG. 7, may be obtained by using two measurement points around the inflection point. Of course, any other adapted method enabling to obtain the tangent in the vicinity of inflection point may also be implemented.

By considering that tangent $C_{21}$ at the inflection point is the first linear function representative of first portion $C_{20}$, it is then easy to perform fourth step (4) to deduce the values of parameters "slbv" and "bv" of the above-defined avalanche multiplication factor.

Indeed, as previously defined:

$$I_{BK} = I_D \cdot (MM - 1) \text{ with } I_D = I_S \cdot \left(e^{\frac{V}{nV_T}} - 1\right)$$

and $$MM = 1 + e^{\left(-slbv \cdot \frac{V+bv}{bv}\right)}.$$

Thereby, $$I_{BK} = I_s \cdot \left(e^{\frac{V}{nV_T}} - 1\right) \cdot (MM - 1),$$

by taking n=1 by default.

Further, in the case of a reverse biasing of the diode and in avalanche mode, reverse voltage V across the diode is relatively high and is seen by the diode as a negative voltage. Accordingly, it is considered that expression $$e^{\frac{V}{nV_T}}$$

tends towards a very negligible value. Thereby, $$I_{BK} = -I_s \cdot (MM - 1) \text{ and } \frac{I_{BK}}{-I_S} = e^{\left(-slbv \cdot \frac{V+bv}{bv}\right)}.$$

It can be deduced that $$\ln\left(\frac{I_{BK}}{-I_S}\right) = -slbv \cdot \frac{V+bv}{bv},$$

or again that $$\ln\left(\frac{I_{BK}}{-I_S}\right) = \frac{-slbv}{bv} - slbv \cdot V.$$

Accordingly, term "−slbv" is equal to the value of the ordinate at the origin of line $C_{21}$, and term $$"\frac{-slbv}{bv}"$$

is equal to the value of the slope of line $C_{21}$.

Finally, in the fifth step (5), the MM is deduced according to the expression given above and one has a mathematical model representative of the substantially linear portion (first portion $C_{01}$) of the real characteristic (curve $C_0$) of the reverse-biased diode and especially in avalanche breakdown voltage.

According to another embodiment, it is possible to take into account the substantially bent portion (second portion $C_{02}$) of the real characteristic (curve $C_0$) of the reverse-biased diode. In this case, a refining term can be added in the expression providing multiplication factor MM. Thus, according to this particular case, it is considered that the new expression of the multiplication factor MM is provided by:

$$MM = 1 + e^{\left(-slbv \cdot \frac{V+bv}{bv}\right)} + e^{-smbv(V+bv+off)} = 1 + MM_1 + MM_2$$

with $MM_2 = e^{-smbv(V+bv+off)}$: the refinement term, smbv: a parameter having a value which will be determined hereafter, off: another parameter having a value which will also be determined hereafter.

It is then possible to similarly implement the method developed hereabove to determine the equation of a tangent of the substantially bent portion around a inflection point.

More precisely, as illustrated in FIG. 12, the method according to this particular case may further comprise the following steps:

in addition to the steps 1 to 4 described above;

a first additional step 41 consists in determining a representation of a linear portion of the function $$\ln\left(\frac{I - I_s \cdot MM_1}{-I_s}\right);$$

a second additional step 42 consists in extracting parameters "smbv" and "off" from said representation of the linear portion;

a third additional step 43 consists in calculating $MM_2$ according to the expression given above;

finally, the step 51 is performed to calculate $MM = 1 + MM_1 + MM_2$

For example, based on the measurements of reverse current I and of reverse voltage V, and based on the determined values of "slbv" and "bv", a representation (diagram or table) of function $$\ln\left(\frac{I - I_s \cdot MM_1}{-I_s}\right)$$

is determined according to voltage V. It is then sufficient to determine a second linear function representative of a substantially linear portion of function $$\ln\left(\frac{I - I_s \cdot MM_1}{-I_s}\right)$$

for values of voltage V smaller than breakdown voltage $V_{BK}$, and comprised within an arbitrarily selected interval or values. The expression of the above-defined avalanche multiplication factor is obtained by considering that term "−smbv" is equal to the slope of this second linear function, and that term "−smbv.(bv+off)" is equal to the ordinate at the origin of this second linear function. Indeed:

$$\ln\left(\frac{I - I_S \exp\left(-slbv \cdot \frac{V+bv}{bv}\right)}{I_S}\right) = -smbv.V - smbv(bv + off)$$

For example, curve $C_4$ of FIG. 8 is the graphic representation of function $$\ln\left(\frac{I - I_s \cdot e^{\left(-slbv\cdot\frac{V+bv}{bv}\right)}}{-I_s}\right)$$

according to the measured values of voltage V, for reverse voltages V ranging between a first voltage, for example 0 volt, and "bv".

Curve $C_{40}$ is a linear regression of curve $C_4$ between 0 and "bv". The equation of curve $C_{40}$ then enables to deduce parameters "smbv" and "off" enabling to refine the model between 0 and "bv". Any adapted method, such as the least squares method $C_{40}$, may be implemented.

In another example, curve $C_5$ of FIG. 9 is the graphic representation of function $$\ln\left(\frac{I - I_s \cdot e^{\left(-slbv\cdot\frac{V+bv}{bv}\right)}}{-I_s}\right)$$

according to the measured values of reverse voltage V, for reverse voltages V ranging between a second voltage, for example 6 volts, and "bv".

Curve $C_{50}$ is a linear regression of curve $C_5$ between 6 and "bv". The equation of this curve then enables to deduce parameters "smbv" and "off" enabling to refine the model between 6 and "bv". Similarly, any adapted method, such as the least squares method $C_{50}$, may be implemented.

FIG. 10 shows the real characteristic of the diode (curve $C_0$) and the mathematical model thus obtained. Curve $M_1$ is the mathematic model obtained for absolute values of reverse voltages V between 0 and "bv" and curve $M_2$ is merged with a portion of the curve $C_0$ and is the mathematic model obtained for absolute values of reverse voltage between 6 and "bv". As can be seen in FIG. 10, the mathematic model is a continuous function, and it does not present any discontinuity at reverse voltage equal to bv.

The above-disclosed mathematical model especially has the advantage of being a simplified but accurate representation of the real current-vs.-voltage characteristic of the reverse-biased PN junction diode and especially in avalanche breakdown voltage. In particular, the discussed solution enables to model the diode behavior for reverse voltage lower than the avalanche breakdown voltage and for reverse voltage greater than the breakdown voltage of the diode, by means of one and the same equation.

In addition, such solution allows reflecting the thermodynamic behavior of the PN junction at the breakdown point. Indeed, the parameters bv, slbv and smbv depend on the temperature according to the following equations:

$$bv = bv0 \cdot \left(\frac{T}{T_{NOM}}\right)^{nbvt}$$

$$slbv = slbv0 \cdot \left(\frac{T}{T_{NOM}}\right)^{nslbvt}$$

$$smbv = smbv0 \cdot \left(\frac{T}{T_{NOM}}\right)^{nsmbvt}$$

Wherein:

T is the temperature in kelvin and $T_{NOM}$ the nominal temperature in kelvin.

bv0, slbv0 and smbv0 are the breakdown models parameters at nominal temperature, for example 300 K.

Depending on the major contribution of the physical effect occurring the breakdown in terms of leakage, band to band or trap assisted tunneling, the temperature coefficients nbvt, nslbvt and nsmbvt can be positive or negative.

The above-disclosed modeling method may especially be integrated in a method for simulating the behaviors of electronic circuits, in the form of simulation software capable of being implemented by computer means, or in the form of an electronic system comprising an assembly of electronic modules capable of performing current and voltage measurements directly on the diode, and determining the linear functions discussed hereabove. It is especially possible to more specifically anticipate the electric behavior of an electronic circuit in the presence of electrostatic discharges.

What is claimed is:

1. A method for determining a mathematical model of the electric behavior of a reverse-biased PN junction diode, comprising:

measuring the value of voltage V present across the diode and the value of the corresponding current I running through this diode, said diode being reverse-biased and said voltage V varying within a range of values including the value of breakdown voltage $V_{BK}$ of said diode;

establishing a representation of function $$\ln\left(\frac{I}{-I_s}\right)$$

according to voltage V, from said measured values of current I and of voltage V, $I_S$ being the saturation current of said diode;

determining a first linear function representative of an approximately linear portion of said function $$\ln\left(\frac{I}{-I_s}\right),$$

said linear portion being characterized by voltages V greater than breakdown voltage $V_{BK}$ in terms of absolute value;

calculating an avalanche multiplication factor defined by:

$$MM = 1 + e^{\left(-slbv\cdot\frac{V+bv}{bv}\right)},$$

wherein:

the values of parameters slbv and bv being extracted from said linear function, slbv being equal to the ordinate at the origin of said linear function, and slbv/bv being equal to the slope of said linear function.

2. The method according to claim 1, wherein it further comprises the step of extracting the value of the saturation current Is of said diode by determining the current I when the voltage V across the diode is equal to zero, from a current-vs-voltage characteristic of said diode in forward-bias operation, and for a given temperature.

3. The method of claim 1, wherein the step of determining said first linear function comprises:

based on the measured values of voltage V and current I, determining the value of a inflection voltage $V_{LIN}$ for which second numerical derivative $d^2I/dV^2$ is maximum; and determining the equation of the tangent of said function $$\ln\left(\frac{I}{-I_s}\right)$$

at an inflection point, said inflection point having said inflection voltage $V_{LIN}$ as an abscissa.

4. The method according to claim 3, wherein parameters slbv and bv are extracting from said tangent, slbv being equal to the ordinate at the origin of said tangent and slbv/bv being equal to the slope of said tangent.

5. The method of claim 1, wherein it further comprises:
establishing a representation of function $$\ln\left(\frac{I - I_s \cdot e^{\left(-slbv \cdot \frac{V+bv}{bv}\right)}}{-I_s}\right)$$

according to voltage V, from said measured values of current I and of voltage V, and from said extracted values of slbv and bv;
determining a second linear function representative of an approximately linear portion of said function $$\ln\left(\frac{I - I_s \cdot e^{\left(-slbv \cdot \frac{V+bv}{bv}\right)}}{-I_s}\right),$$

said portion being characterized by voltages V smaller than breakdown voltage $V_{BK}$ in terms of absolute value;
calculating the avalanche multiplication factor defined by:

$$MM = 1 + e^{\left(-slbv \cdot \frac{V+bv}{bv}\right)} + e^{-smbv(V+bv+off)},$$

wherein:
the values of parameters smbv and off being extracted from said second linear portion;
smbv being the slope of said second linear function; and
smbv (bv+off) being the ordinate at the origin of said second linear function.

6. The method of claim 5, wherein the step of determining said second linear function is performed for values of reverse voltage V ranging between a first voltage and bv, said first voltage being smaller than the value of bv in term of absolute value.

7. The method of claim 5, wherein the step of determining said second linear function is performed for values of reverse voltage V ranging between a second voltage and bv, said second voltage being greater than the value of bv in term of absolute value.

8. A method, comprising:
measuring the voltage versus current characteristics of a reverse biased PN junction diode over a range of voltages including a breakdown voltage;
identifying a functional relationship according to voltage between measured values of current and saturation current of the PN junction diode;
determining a linear function that represents an approximately linear portion of the identified functional relationship for voltages in excess of the breakdown voltage; and
calculating an avalanche multiplication factor for the PN junction diode as a function of an ordinate value at an origin of the determined linear function and a slope value of the determined linear function.

9. The method of claim 8, further comprising determining the saturation current from the measured voltage versus current characteristic when voltage is equal to zero.

10. The method of claim 8, wherein determining the linear function comprises identifying an inflection point corresponding to an inflection voltage of the voltage versus current characteristic, and wherein determining the linear function comprises identifying a tangent line of the functional relationship at the identified inflection point.

11. The method of claim 8, further comprising:
identifying an additional functional relationship according to voltage between measured values of current and saturation current of the PN junction diode;
determining an additional linear function that represents an approximately linear portion of the identified additional functional relationship for voltages less than the breakdown voltage; and
calculating an additional component of the avalanche multiplication factor for the PN junction diode as a function of an ordinate value at an origin of the determined additional linear function and a slope value of the determined additional linear function.

* * * * *